(12) United States Patent
Smith et al.

(10) Patent No.: US 9,208,829 B2
(45) Date of Patent: Dec. 8, 2015

(54) DESIGNATED MEMORY SUB-CHANNELS FOR COMPUTING SYSTEMS AND ENVIRONMENTS

(71) Applicant: TERADATA US, INC., Dayton, OH (US)

(72) Inventors: Norm Wayne Smith, San Marcos, CA (US); Michael Paul Corwin, Sunnyvale, CA (US); Liuxi Lang, Sunnyvale, CA (US); Jeremy Branscome, Santa Clara, CA (US)

(73) Assignee: Teradata US, Inc., Dayton, OH (US)

( * ) Notice: Subject to any disclaimer, the term of this patent is extended or adjusted under 35 U.S.C. 154(b) by 15 days.

(21) Appl. No.: 13/970,721

(22) Filed: Aug. 20, 2013

(65) Prior Publication Data

US 2015/0055391 A1   Feb. 26, 2015

(51) Int. Cl.
*G11C 5/06* (2006.01)

(52) U.S. Cl.
CPC ........................................ *G11C 5/063* (2013.01)

(58) Field of Classification Search
USPC .................. 365/52, 189.05, 230.01, 233.1, 63
See application file for complete search history.

(56) References Cited

U.S. PATENT DOCUMENTS 7,872,892 B2 * 1/2011 MacWilliams et al. ......... 365/52
8,086,783 B2 * 12/2011 O'Connor et al. ................ 711/5
8,332,598 B2 * 12/2012 Akiyama et al. .............. 711/158
8,866,830 B2 * 10/2014 MacWilliams et al. ....... 345/531

* cited by examiner

*Primary Examiner* — Pho M Luu
(74) *Attorney, Agent, or Firm* — Ramin Mahboubian

(57) ABSTRACT

A memory channel can be divided into two or more memory sub-channels, wherein each one of the memory sub-channels includes two or more memory components configured to store data made accessible on that memory sub-channel, and wherein the two or more memory components in each one of the memory sub-channels are respectively connected via at least one transmission line and can be individually accessed (addressed) on their associated sub-channel.

20 Claims, 3 Drawing Sheets

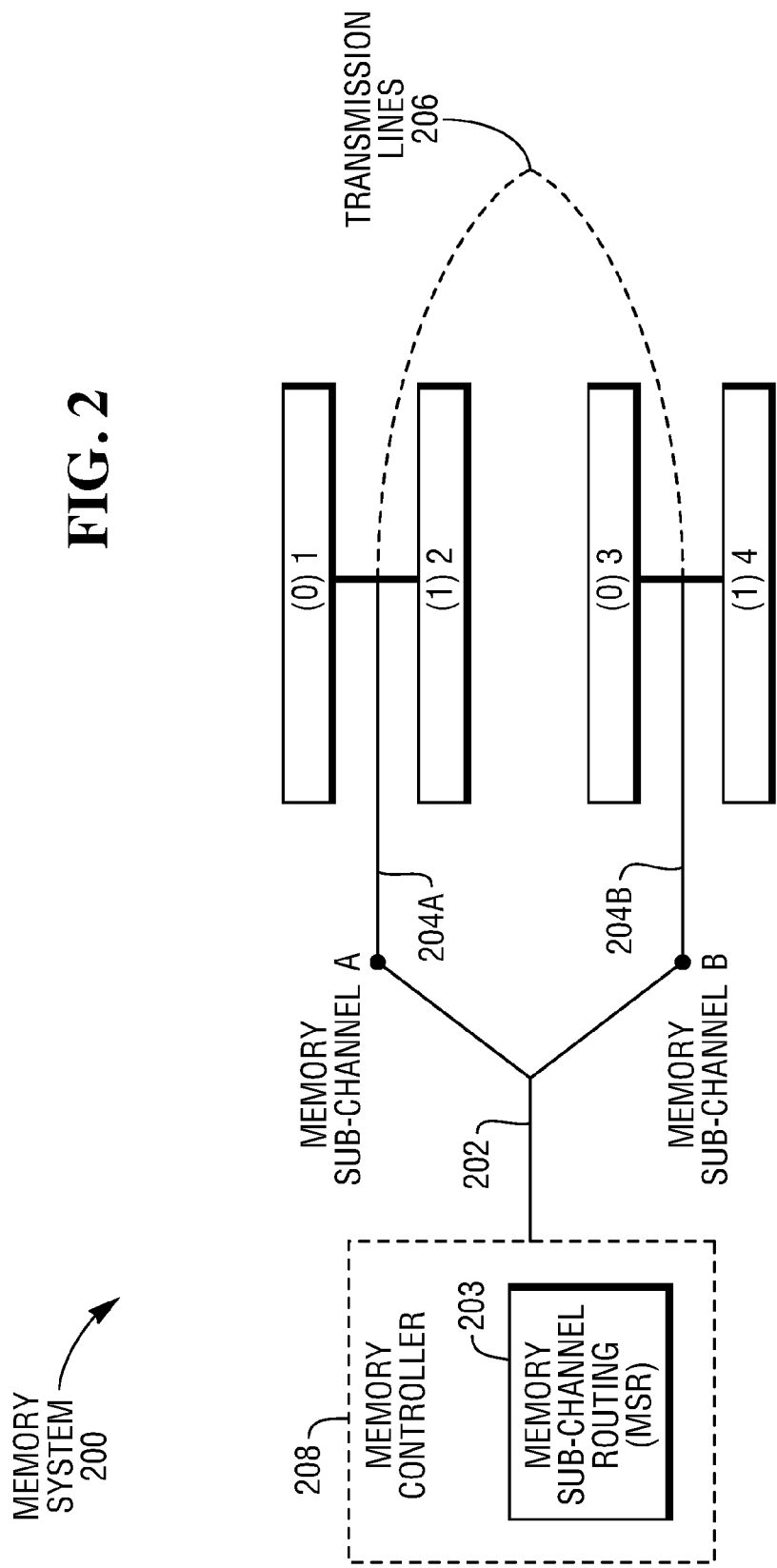

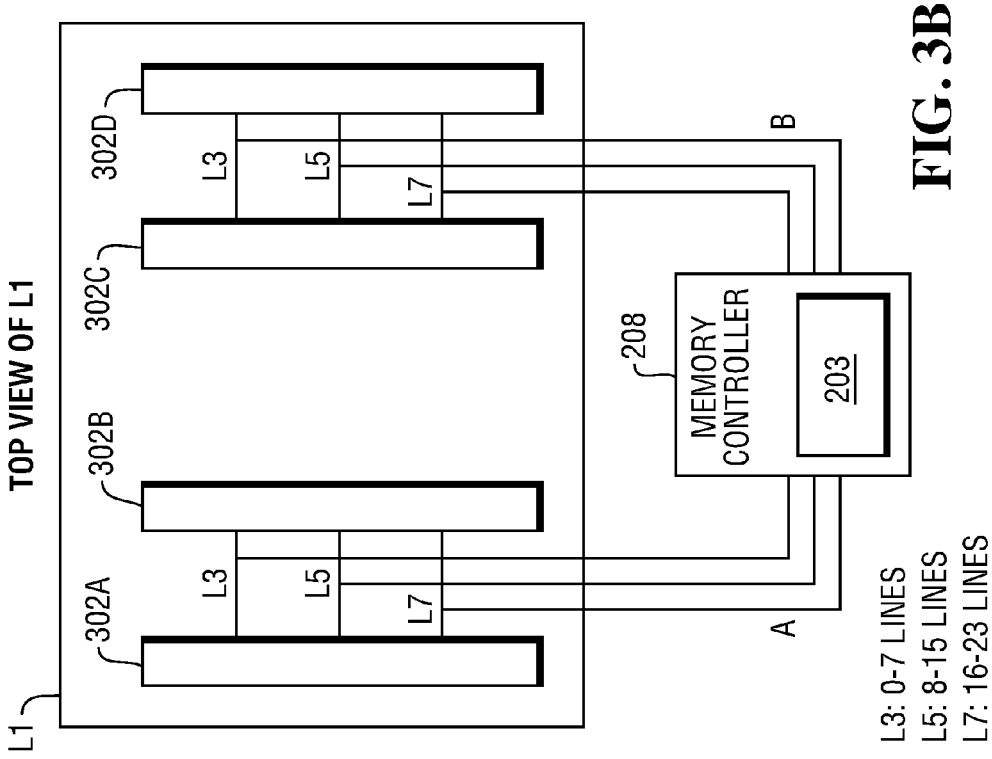
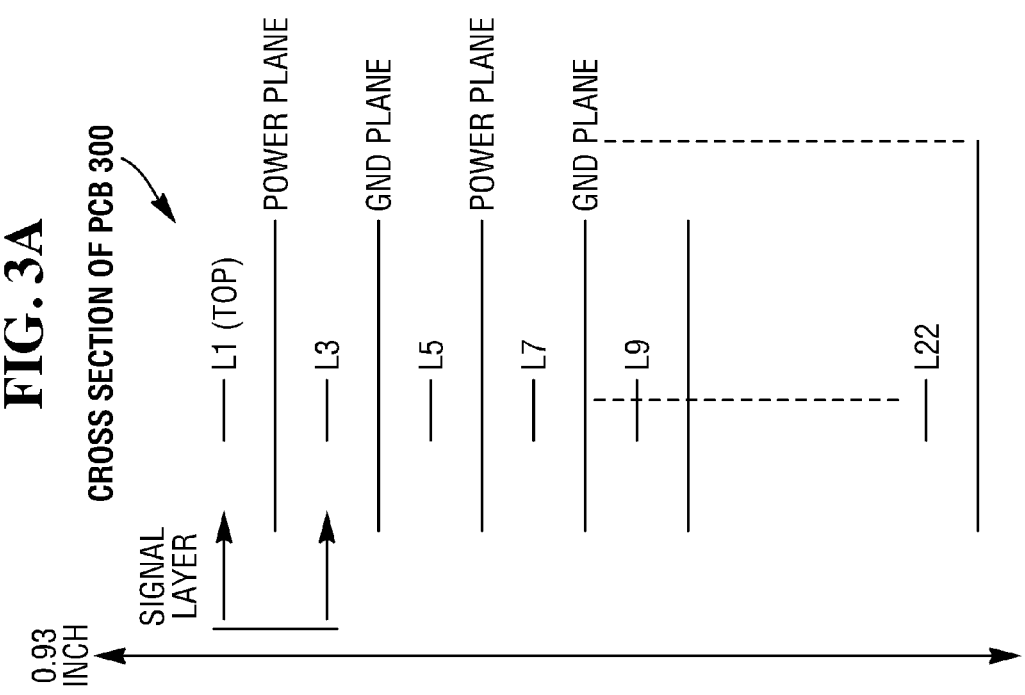

DESIGNATED MEMORY SUB-CHANNELS FOR COMPUTING SYSTEMS AND ENVIRONMENTS

BACKGROUND

Data can be an abstract term. In the context of computing environments and systems, data can generally encompass all forms of information storable in a computer readable medium (e.g., memory, hard disk). Data, and in particular, one or more instances of data can also be referred to as data object(s). As is generally known in the art, a data object can, for example, be an actual instance of data, a class, a type, or a particular form of data, and so on.

Generally, storing and processing data are important aspects of computing systems and environments. Today, there is an ever increasing need to manage storage and processing of data in computing environments.

Data can be stored in memory. Memory is an important aspect of computing and computing systems. Memory can be volatile (e.g., Random Access Memory (RAM)) or non-volatile (e.g., flash memory). Generally, Volatile memory requires power to maintain the stored information, whereas non-volatile memory does not need power to maintain the stored information. Today, both volatile and non-volatile forms of memory are extensively used in various types and in numerous devices.

One exemplary type of memory, generally known as dynamic random-access memory (DRAM) is a type of random-access memory that stores each bit of data in a separate capacitor within an integrated circuit. The capacitor can be either charged or discharged to represent the two values of a bit, conventionally called 0 and 1. Since capacitors leak charge, the information can eventually fade unless the capacitor charge is refreshed periodically. Because of this refresh requirement, it is a dynamic memory as opposed to SRAM and other static memory.

A prominent form of memory today is known as DIMM (or dual in-line memory module). A DIMM can be a series of dynamic random-access memory (DRAM) integrated circuits mounted on a printed circuit board (PCB) which can be provided for various computing device (e.g., personal computers, servers). DIMMs can have separate electrical contacts on each side and provide a 64-bit data path.

An important development in memory is the development of multi-channel memory architecture as a technology that can increase the transfer speed of data between DRAM memory and a chipset memory controller by adding more channels of communication between them. Theoretically, this multiplies the data rate by exactly the number of channels present. Dual-channel memory employs two channels which theoretically doubles the data transfer rate. More modern higher-end chipsets (e.g., Intel i7-9x series) may support triple-channel memory.

In view of the foregoing, it should be noted that memory, especially multi-channel memory architecture, is an important aspect of computing today and is likely to become even more widely used in the future.

Databases provide a very good example of a computing environment or system where the storage and processing of data can be crucial. As such, to provide an example, databases are discussed below in greater detail.

The term database can also refer to a collection of data and/or data structures typically stored in a digital form. Data can be stored in a database for various reasons and to serve various entities or "users." Generally, data stored in the database can be used by one or more "database users." A user of a database can, for example, be a person, a database administrator, a computer application designed to interact with a database, etc. A very simple database or database system can, for example, be provided on a Personal Computer (PC) by storing data (e.g., contact information) on a Hard Disk and executing a computer program that allows access to the data. The executable computer program can be referred to as a database program, or a database management program. The executable computer program can, for example, retrieve and display data (e.g., a list of names with their phone numbers) based on a request submitted by a person (e.g., show me the phone numbers of all my friends in Ohio).

Generally, database systems are much more complex than the example noted above. In addition, databases have been evolved over the years and are used in various business and organizations (e.g., banks, retail stores, governmental agencies, universities). Today, databases can be very complex. Some databases can support several users simultaneously and allow them to make very complex queries (e.g., give me the names of all customers under the age of thirty five (35) in Ohio that have bought all the items in a given list of items in the past month and also have bought a ticket for a baseball game and purchased a baseball hat in the past 10 years).

Typically, a Database Manager (DBM) or a Database Management System (DBMS) is provided for relatively large and/or complex databases. As known in the art, a DBMS can effectively manage the database or data stored in a database, and serve as an interface for the users of the database. For example, a DBMS can be provided as an executable computer program (or software) product as is also known in the art.

It should also be noted that a database can be organized in accordance with a Data Model. Some notable Data Models include a Relational Model, an Entity-relationship model, and an Object Model. The design and maintenance of a complex database can require highly specialized knowledge and skills by database application programmers, DBMS developers/programmers, database administrators (DBAs), etc. To assist in design and maintenance of a complex database, various tools can be provided, either as part of the DBMS or as free-standing (stand-alone) software products. These tools can include specialized Database languages (e.g., Data Description Languages, Data Manipulation Languages, Query Languages). Database languages can be specific to one data model or to one DBMS type. One widely supported language is Structured Query Language (SQL) developed, by in large, for Relational Model and can combine the roles of Data Description Language, Data Manipulation Language, and a Query Language.

Today, databases have become prevalent in virtually all aspects of business and personal life. Moreover, usage of various forms of databases is likely to continue to grow even more rapidly and widely across all aspects of commerce, social and personal activities. Generally, databases and DBMS that manage them can be very large and extremely complex partly in order to support an ever increasing need to store data and analyze data. Typically, larger databases are used by larger organizations. Larger databases are supported by a relatively large amount of capacity, including computing capacity (e.g., processor and memory) to allow them to perform many tasks and/or complex tasks effectively at the same time (or in parallel). On the other hand, smaller databases systems are also available today and can be used by smaller organizations. In contrast to larger databases, smaller databases can operate with less capacity.

A current popular type of database is the relational database with a Relational Database Management System (RDBMS), which can include relational tables (also referred to as relations) made up of rows and columns (also referred to as tuples and attributes). In a relational database, each row represents an occurrence of an entity defined by a table, with an entity, for example, being a person, place, thing, or another object about which the table includes information.

SUMMARY

Broadly speaking, the invention relates to computing environments and systems. More particularly, the invention relates to techniques for providing memory sub-channels for computing environments and systems.

In accordance with one aspect of the invention, a memory channel can be divided into two or more memory sub-channels, wherein each one of the memory sub-channels includes two or more memory components configured to store data made accessible on that memory sub-channel, and wherein the two or more memory components in each one of the memory sub-channels are respectively connected via at least one transmission line and can be individually accessed (addressed) on their associated sub-channel.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 2 depicts a memory system in accordance with one embodiment of the invention.

FIG. 3A depicts the cross-section of the PCB in accordance with one embodiment of the invention FIG. 3B depicts the top view of level 1 (or top layers) of a PCB in accordance with one embodiment of the invention.

DETAILED DESCRIPTION

Figure 1:
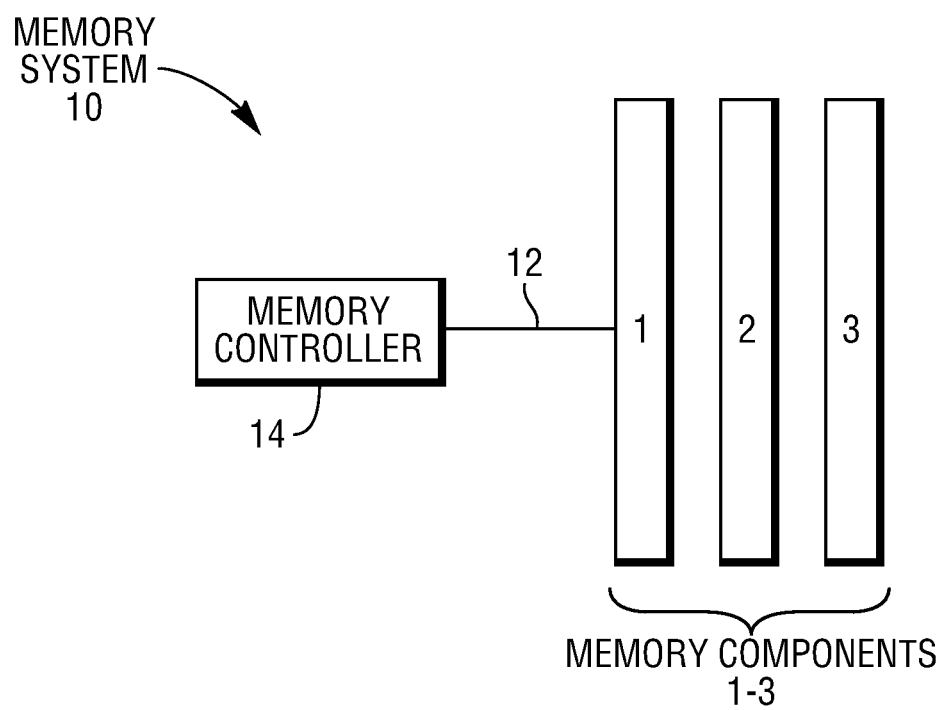
FIG. 1 depicts a conventional memory system that can be provided on a Printed Circuit Board (PCB) for a conventional computing device and/or system.

As noted in the background section, memory, especially multi-channel memory architecture, is an important aspect of computing today and is likely to become even more widely used in the future.

Conventional multi-channel memory systems are highly useful and can be very effective, especially in comparison to single channel memory. To further elaborate, FIG. 1 depicts a conventional memory system 10 that can be provided on a Printed Circuit Board (PCB) for a conventional computing device and/or system.

Referring to FIG. 1, the conventional memory system 10 can represent a typical "multi-drop" bus topology where three (3) memory components 1, 2 and 3 (e.g., DIMMs) are configured in a "daisy chain" configuration on a memory channel 12 as those skilled in the art will readily know. As those skilled in the art will also readily appreciate, generally, the conventional memory system 10 is limited to having at most three memory components 1, 2 and 3 (e.g., DIMMs) daisy chained together on a memory channel 12. This limitation can be primary attributed to the conventional PCB topology. In other words, it may not be feasible to have more than three (3) memory components daisy chained together in a single line since the transmission signal in the line may be degraded beyond an acceptable level. As a result, conventional memory systems are generally limited to having three (3) memory components on a single memory channel.

Of course, it is highly desirable to provide a memory channel that can support more than three (3) memory components but doing so requires considering a number of issues, including issues associated with signal degradation, physical limitations or requirements of associated with Printed Circuit Board (PCB) design.

In view of the foregoing, improved memory systems are needed.

As such, it will be appreciated that a memory channel divided into two or more memory sub-channels such that each one of the memory sub-channels can include two or more memory components in accordance with one aspect of the invention. As a result, more than three (3) memory components (e.g., DIMM's) can be provided on a single memory channel. It should be noted that each of the newly components can be configured to store data made accessible on a particular memory sub-channel. By way of example, a memory channel can be divided into two memory sub-channels A and B, wherein the memory sub-channel A can support memory components 1 and 2, and memory sub-channel be support memory components 3 and 4, thereby providing four (4) memory components on a single memory channel. It should be noted that each one of the individual memory components can be accessed and addressed via their designated memory sub-channel.

Embodiments of these aspects of the invention are also discussed below with reference to FIGS. 2-3B. However, those skilled in the art will readily appreciate that the detailed description given herein with respect to these figures is for explanatory purposes as the invention extends beyond these limited embodiments.

FIG. 2 depicts a memory system 200 in accordance with one embodiment of the invention. Referring to FIG. 2, a memory channel 202 is effectively divided into two memory sub-channels A and B. It will be appreciated that the division of the memory channel 202 can be facilitated by a sub-channel routing component/mechanism 203 that provides data signals 204 to the memory components 1, 2, 3 and 4 such that an individual memory component can be addressed by its designated sub-channel (A or B). As suggested by FIG. 2, sub-channel routing component/mechanism 203 can, for example, be provided by a memory controller 208.

For simplicity, each one of the signal lines 204A and 204B have been depicted as a single signal line in FIG. 2. However, those skilled in the art will readily appreciate that a single signal line can be representative of multiple signal lines connected to particular memory component. Those skilled in the art will also appreciate that each of the two memory components configured for a memory sub-channel A or B can be daisy chained or coupled together using one or more transmission lines 206.

Generally, dividing a single memory channel into multiple memory sub-channels requires providing a relatively complex routing mechanism in comparison to the conventional techniques which do not utilize memory sub-channels. This routing mechanism requires adding more data signal lines than the number typically needed for conventional techniques. It will be appreciated that additional layers can be utilized in producing a PCB in order to accommodate the need for additional data signals needed to provide the routing mechanism for addressing memory sub-channels of a single memory channel.

To further elaborate, FIG. 3A depicts the cross-section of the PCB 300 in accordance with one embodiment of the invention. Referring to FIG. 3A, additional layers are used to facilitate routing data signals to memory components in order to provide a routing mechanism that can accommodate memory sub-channels for a single memory channel. Specifically, layers 3, 5 and 7 of the PCB 300 can be used to respectively connect data lines 0-7, 8-15 and 16-23 to the memory components configured in a sub-channel addressing scheme. Of course, additional data lines can be used in a similar manner as suggested by FIG. 3A. In the example depicted in FIG. 3A, seventy two (72) data lines (0-71) can be utilized to provide four (4) sub-channels.

FIG. 3B depicts the top view of level 1 (or top layers) of a PCB in accordance with one embodiment of the invention. More particularly, FIG. 3B depicts an example of the routing of the data lines on various layers of a PCB in accordance with one embodiment of the invention. Referring to FIG. 3B, four (4) memory components 302A, 302B, 302C and 302D can be provided on the PCB. As suggested by FIG. 3B, layers 3, 5 and 7 of the PCB 300 can be used respectively to connect data lines 0-7, 8-15 and 16-23 to the memory components 302A, 302B, 302C and 302D as those skilled in art will appreciate. As noted above, a total of seventy two (72) data lines (0-71) can be utilized to provide four (4) sub-channels in this example. Of course, those skilled in the art will also appreciate that the data lines 0-7, 8-15 and 16-23 can be connected to a controller that can effectively support a sub-channel routing 203 (also shown in FIG. 2).

Those skilled in art will also appreciate that providing sub-channel by effectively dividing a single memory channel into multiple sub-channels requires a number of considerations.

One such consideration is related to On Die Termination (ODT). ODT is defined, for example, in the JEDEC DDR3 SDRAM specification which defines a memory controller operable to dynamically control (On/Off) the termination resistance for each DDR3 SDRAM memory device. To achieve signal integrity and performance requirements of the DDR3 SDRAM in a balanced tree topology of sub-channels (see FIG. 2), the memory controller can be turn off ODT during write cycles to the target memory device.

Another consideration is related to Drive Strength Control. By way of example, The JEDEC DDR3 SDRAM specification requires that the memory components have programmable drive strength. The memory controller adjusts the drive strength at power up or reset. The proper drive strength is needed achieve the desired signal integrity and performance requirements for read cycles.

Yet another consideration is related to PCB Impedance. To achieve appropriate PCB Impedance, the PCB transmission line impedance of the single-ended address, data, and control lines, and the differential clock and strobe signals can be tuned for optimal signal integrity and performance.

Still another consideration is related to "PCB Via Design." The PCB vias that are paths for transmission lines to traverse layer changes can be tuned for the desired or optimal signal integrity and performance. The vias can be designed with an impedance that matches the impedance of the transmission lines in order to minimize insertion loss.

Another consideration yet is related to "Match Lengths." By way of example, DDR3 SDRAM designs with their parallel bus structure for address and data lines require match lengths routing to guarantee logic timing. For a balanced routing topology, all branches can matched as depicted in FIG. 2 in accordance with one embodiment of the invention.

One other consideration for providing memory sub-channels is the PCB technology, namely a high-performance PCB technology providing high-performance PCB material. By way of example, to implement the balanced tree routing technology with two-sub-channels, each configured with two (2) memory components, material with a dielectric constant ($D_k$) of about 3.2-3.6 can be used. This material can enable a high layer count design and can allow meeting performance goals generally in line with expectations as, for example, routing more than one hundred (100) signals lines, in a balance tree topology can require a vast amount of PCB routing resources.

It should be noted that a symmetric configuration whereby a memory channel is divided into two or more sub-channels in a symmetric manner can provide a relatively easier and unified termination model or mechanism in comparison with the conventional daisy-chained topologies which are currently recommended for memory system (e.g., DDR3 DIMM topology as generally known in the art).

It should also be noted that techniques noted above are useful for various memory applications, including, for example "in-line memory" applications. "In-line memory" can, for example, be provided, for large database systems, including single or multi-node, parallel database systems. A multi-node parallel database system can, for example, use a massively parallel processing (MPP) architecture or system to perform various database operations in parallel. In-line memory" can, for example, be provided as "coupled memory" for a hardware accelerator. An example of an "In-line memory" application and hardware accelerator is discussed, for example, in the U.S. Pat. No. 7,908,259 entitled: "HARDWARE ACCELERATED RECONFIGURABLE PROCESSOR FOR ACCELERATING DATABASE OPERATIONS AND QUERIES," which is hereby incorporated by references herein in its entirety and for all purposes. U.S. Pat. No. 8,244,718 entitled: "METHODS AND SYSTEMS FOR HARDWARE ACCELERATION OF DATABASE OPERATIONS AND QUERIES," provides an example of systems for hardware acceleration of database operations and queries, which is also hereby incorporated by references herein in its entirety and for all purposes.

Generally, various aspects, features, embodiments or implementations of the invention described above can be used alone or in various combinations. Furthermore, implementations of the subject matter and the functional operations described in this specification can be implemented in digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter affecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, an apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CDROM and DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, tactile or near-tactile input.

Implementations of the subject matter described in this specification can be implemented in a computing system that includes a backend component, e.g., as a data server, or that includes a middleware component, e.g., an application server, or that includes a frontend component, e.g., a client computer having a graphical user interface or a Web browser through which a user can interact with an implementation of the subject matter described is this specification, or any combination of one or more such backend, middleware, or frontend components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the disclosure or of what may be claimed, but rather as descriptions of features specific to particular implementations of the disclosure. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

The various aspects, features, embodiments or implementations of the invention described above can be used alone or in various combinations. The many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A device comprising: at least one memory channel divided into two or more memory sub-channels, wherein each one of the memory sub-channels includes two or more memory components configured to store data made accessible on that memory sub-channel, and wherein the two or more memory components in each one of the memory sub-channels are respectively connected via at least one transmission line and can be individually accessed on their associated sub-channel.

2. The device of claim 1, further comprising: a memory controller operatively connected to the at least one memory channel and effectively providing a routing mechanism for addressing each one of the memory components individually.

3. The device of claim 1, wherein a first sub-channel of the sub-channels uses first sub-channels signal lines configured on a layer of a Printed Circuit Board (PCB), and wherein a second sub-channel of the sub-channels uses second sub-channels signal lines configured on the layer of the PCB.

4. The device of claim 1, wherein at least one of the memory channels is into a balanced tree topology.

5. The device of claim 4, wherein the tree topology consists of two branches and each branch represents a sub-channel consists of two memory components, thereby providing four (4) memory components for the at least one memory channel.

6. The device of claim 5, wherein the four (4) memory components are each a DIMM.

7. The device of claim 1, wherein the at least one memory channel and its sub-channels are provided as in-line memory.

8. A method implemented at least partly by a device, wherein the method comprises: dividing at least one memory channel into two or more memory sub-channels, wherein each one of the memory sub-channels includes two or more memory components configured to store data made accessible on that memory sub-channel, and wherein the two or more memory components in each one of the memory sub-channels are respectively connected via at least one transmission line and can be individually accessed on their associated sub-channel.

9. The method of claim 8, wherein the method further comprises: connecting a memory controller to the at least one memory channel; and effectively providing a routing mechanism for addressing each one of the memory components individually.

10. The method of claim 8, wherein a first sub-channel of the sub-channels uses first sub-channels signal lines configured on multiple layer of a Printed Circuit Board (PCB).

11. The method of claim 10, wherein a second sub-channel of the sub-channels uses second sub-channels signal lines configured on the multiple layer of the PCB.

12. The method of claim 8, wherein at least one of the memory channels is into a balanced tree topology.

13. The method of claim 12, wherein the tree topology consists of two branches and each branch represents a sub-channel consists of two memory components, thereby providing four (4) memory components for the at least one memory channel.

14. The method of claim 13, wherein the four (4) memory components are each a DIMM.

15. The method of claim 8, wherein the at least one memory channel and its sub-channels are provided as in-line memory.

16. A device comprising: at least one memory channel divided into two or more memory sub-channels in a balanced tree topology, wherein each one of the memory sub-channels includes two or more memory components configured to store data made accessible on that memory sub-channel.

17. The device of claim 16, wherein the tree topology consists of two branches and each branch represents a sub-channel consists of two memory components, thereby providing four (4) memory components for the at least one memory channel.

18. The device of claim 16, wherein the four (4) memory components are each a DIMM.

19. The device of claim 16, wherein the at least one memory channel and its sub-channels are provided as in-line memory.

20. The device of claim 16, wherein a first sub-channel of the sub-channels uses first sub-channels signal lines configured on a layer of a Printed Circuit Board (PCB), and wherein a second sub-channel of the sub-channels uses second sub-channels signal lines configured on the layer of the PCB.

* * * * *